(12) United States Patent
Kwon et al.

(10) Patent No.: US 9,256,118 B2
(45) Date of Patent: Feb. 9, 2016

(54) POSITIVE PHOTOSENSITIVE RESIN COMPOSITION

(75) Inventors: Ji-Yun Kwon, Uiwang-si (KR);
Jong-Hwa Lee, Uiwang-si (KR);
Hyun-Yong Cho, Uiwang-si (KR);
Dae-Yun Kim, Uiwang-si (KR);
Sang-Kyeon Kim, Uiwang-si (KR);
Sang-Kyun Kim, Uiwang-si (KR);
Sang-Soo Kim, Uiwang-si (KR);
Eun-Kyung Yoon, Uiwang-si (KR);
Jun-Ho Lee, Uiwang-si (KR);
Jin-Young Lee, Uiwang-si (KR);
Hwan-Sung Cheon, Uiwang-si (KR);
Chung-Beom Hong, Uiwang-si (KR);
Eun-Ha Hwang, Uiwang-si (KR)

(73) Assignee: Cheil Industries Inc., Gumi-si (KR)

(*) Notice: Subject to any disclaimer, the term of this patent is extended or adjusted under 35 U.S.C. 154(b) by 9 days.

(21) Appl. No.: 14/236,971

(22) PCT Filed: Jul. 17, 2012

(86) PCT No.: PCT/KR2012/005691
§ 371 (c)(1),
(2), (4) Date: Feb. 4, 2014

(87) PCT Pub. No.: WO2013/100298
PCT Pub. Date: Jul. 4, 2013

(65) Prior Publication Data
US 2014/0170562 A1   Jun. 19, 2014

(30) Foreign Application Priority Data
Dec. 30, 2011 (KR) .................. 10-2011-0147877

(51) Int. Cl.
G03F 7/023 (2006.01)
G03F 7/38 (2006.01)
G03F 7/105 (2006.01)
G03C 1/61 (2006.01)
G03F 7/022 (2006.01)
G03F 7/075 (2006.01)

(52) U.S. Cl.
CPC ............... G03C 1/61 (2013.01); G03F 7/0226 (2013.01); G03F 7/0233 (2013.01); G03F 7/0751 (2013.01); G03F 7/105 (2013.01)

(58) Field of Classification Search
CPC ............................ G03F 7/0226; G03F 7/0233

USPC .................... 430/18, 165, 191, 192, 193, 326
See application file for complete search history.

(56) References Cited

U.S. PATENT DOCUMENTS

| | | | |
|---|---|---|---|
| 4,782,009 A | 11/1988 | Bolon et al. | |
| 6,713,227 B2 | 3/2004 | Machiguchi et al. | |
| 6,733,934 B2 | 5/2004 | Machiguchi et al. | |
| 6,929,890 B2 | 8/2005 | Miyoshi et al. | |
| 8,921,019 B2 * | 12/2014 | Kwon et al. | 430/18 |
| 2006/0246364 A1 | 11/2006 | Fujimori | |
| 2007/0184366 A1 | 8/2007 | Takakuwa | |

FOREIGN PATENT DOCUMENTS

| | | |
|---|---|---|
| JP | 6-60140 A | 3/1994 |
| JP | 09-302221 A | 11/1997 |
| JP | 10-104599 A | 4/1998 |
| JP | 10-307393 A | 11/1998 |
| JP | 2000-292913 A | 10/2000 |
| JP | 2004-145320 A | 5/2004 |
| KR | 10-0128340 A | 10/1997 |
| KR | 10-2002-0002318 A | 1/2002 |
| KR | 10-2002-0002319 A | 1/2002 |
| KR | 10-2004-0087918 A | 10/2004 |
| KR | 10-2010-0080343 A | 7/2010 |
| KR | 10-2011-0054465 A | 5/2011 |
| TW | 201001074 A | 1/2010 |
| WO | 2013/100298 A1 | 7/2013 |

OTHER PUBLICATIONS

Search Report in counterpart Taiwanese Application No. 101127262 dated Mar. 3, 2014, pp. 1.
English-translation of Search Report in counterpart Taiwanese Application No. 101127262 dated Mar. 3, 2014, pp. 1.
International Search Report in counterpart International Application No. PCT/KR2012/005691 dated Jan. 30, 2013, pp. 1-7.

* cited by examiner

*Primary Examiner* — John S Chu
(74) *Attorney, Agent, or Firm* — Additon, Higgins & Pendleton, P.A.

(57) ABSTRACT

Disclosed is a positive photosensitive resin composition that includes (A) an alkali soluble resin selected from a polybenzoxazole precursor, a polyimide precursor, and a combination thereof, (B) a photosensitive diazoquinone compound, (C) a phenol compound, (D) an organic dye and (E) a solvent, wherein the organic dye (D) includes at least one red dye having an absorption wavelength of 590 to 700 nm, at least one yellow dye having an absorption wavelength of 550 to 590 nm, and at least one blue dye having an absorption wavelength of 450 to 500 nm.

13 Claims, No Drawings

POSITIVE PHOTOSENSITIVE RESIN COMPOSITION

CROSS-REFERENCE to RELATED APPLICATIONS

This application claims priority to and the benefit of International Application No. PCT/KR2012/005691, filed Jul. 17, 2012, which published as WO 2013/100298 on Jul. 4, 2013, and Korean Patent Application No. 10-2011-0147877, filed in the Korean Intellectual Property Office on Dec. 30, 2011, the entire disclosure of each of which is incorporated herein by reference.

TECHNICAL FIELD

A positive photosensitive resin composition, a photosensitive resin film prepared using the same, and a display device including the photosensitive resin film are disclosed.

BACKGROUND ART

A conventional surface protective layer and interlayer insulating layer for a semiconductor device includes a polyimide resin having excellent heat resistance, electrical properties, mechanical properties, and the like. The polyimide resin has recently been used as a photosensitive polyimide precursor composition to be coated easily. The photosensitive polyimide precursor composition is coated on a semiconductor device, patterned by ultraviolet (UV) rays, developed, and thermally imidized, easily providing a surface protective layer, an interlayer insulating layer, and the like. Accordingly, the polyimide resin may remarkably shorten a processing time, compared with a conventional non-photosensitive polyimide precursor composition.

A photosensitive polyimide precursor composition can be applied as a positive type in which an exposed part is dissolved by development and as a negative type in which the exposed part is cured and maintained. The positive type may be developed by a non-toxic alkali aqueous solution and thus, preferably uses. The positive photosensitive polyimide precursor composition includes a polyimide precursor of polyamic acid, a photosensitive material of diazonaphtoquinone, and the like. However, the positive photosensitive polyimide precursor composition has a problem that a desired pattern is not obtained because of too high solubility of carbonic acid of the polyamic acid in an alkali. In order to solve this problem, a material including phenolic hydroxyl acid introduced instead of carbonic acid by esterifying polyamic acid with an alcohol compound having at least one hydroxyl group has been suggested (Japanese Patent Laid-Open Publication No. 10-307393) but has a problem of insufficient developability and thus, layer loss or resin delamination from a substrate.

Recently, a material prepared by mixing a polybenzoxazole precursor with a diazonaphtoquinone compound (Japanese Patent Laid-Open Publication No. 1994-060140) has drawn attention but has a problem of hardly obtaining a desirable pattern due to big layer loss of an unexposed part after the development, when the polybenzoxazole precursor composition is actually used. However, when the molecular weight of the polybenzoxazole precursor is increased to improve this problem, the layer loss of the unexposed part is reduced, but a development residue (scum) in an exposed part is generated and thus, may deteriorate resolution and lengthen the development on the exposed part. In order to solve this problem, it has been reported that the layer loss may be suppressed by adding a certain phenol compound to a polybenzoxazole precursor composition (Japanese Patent Laid-Open Publication No. 9-302221 and Japanese Patent Laid-Open Publication No. 2000-292913). However, since the suppression effect of the layer loss of the unexposed part is insufficient, research on increasing the suppression effect of the layer loss along with preventing generation of the development residue (scum) is required. In addition, since the phenol for controlling solubility causes a problem of being decomposed or occurring a side reaction at a high temperature during the thermosetting and thus, does a huge damage on mechanical properties of a resultant cured layer, research on substituting the phenol as a dissolution controlling agent is still required.

The positive photosensitive resin composition including the polybenzoxazole precursor may be applied to an organic insulator or a barrier rib material in a display device field. A liquid crystal display device, one kind of a display device, has lots of advantages of being light and thin, costing low, being operated with small consumption of electricity, having excellent junction with an integrated circuit, and the like and thus, has been widely used for a laptop computer, a monitor, and a TV image. This liquid crystal display device includes a lower substrate having a black matrix, a color filter, and an ITO pixel electrode and an upper substrate having an active circuit portion consisting of a liquid crystal layer, a thin film transistor, and a capacitor layer and an ITO pixel electrode. The color filter is fabricated by sequentially laminating a black matrix layer with a predetermined pattern on a transparent substrate to block a light among pixel boundaries and a pixel part consisting of a plurality of colors (in general, three primary colors of red (R), green (G), and blue (B).

In addition, an organic light emitting diode (OLED) actively developed in recent times is arranged as a pixel with a matrix format. These pixels are arranged to emit the same color to fabricate a single color display or as three primary colors of red (R), green (G), and blue (B) to display various colors.

On the other hand, many attempts have been recently made to develop a display device having high contrast ratio and high luminance. One of the attempts is to form a black filter layer between color patterns but has a problem of hardly realizing a high aperture ratio and bringing about low heat resistance and insulating properties. Then, another attempt of securing a high aperture ratio by making a non-light emitting region black and simultaneously, improving a contrast ratio and visibility but has a problem of deteriorating inherent properties of an insulation layer because a colorant is dissolved in a large amount. In addition, an inorganic pigment as carbon black and the like used for a black mill-base, a colorant, in general has excellent light shielding properties but has a problem of deteriorating insulating resistance properties, which is not appropriately applied to an insulation layer for an organic light emitting diode. On the other hand, an organic pigment relatively consists of a pigment mixture realizing a black color and thus, has better insulating resistance properties than the inorganic pigment but needs to be more included than the inorganic pigment in a photosensitive resin composition to accomplish equivalent light shielding properties and more possibly, deteriorates pattern developability and produces a residue.

Accordingly, development of a new photosensitive resin composition having no aforementioned problems is required.

DISCLOSURE

Technical Problem

One embodiment of the present invention provides a positive photosensitive resin composition having excellent insulating properties insulating properties and light shielding properties.

Technical Solution

According to one embodiment of the present invention, provided is a photosensitive resin composition for a color filter that includes (A) an alkali soluble resin selected from a polybenzoxazole precursor, a polyimide precursor, and a combination thereof, (B) a photosensitive diazoquinone compound, (C) a phenol compound, (D) an organic dye and (E) a solvent, wherein the organic dye (D) includes at least one red dye having an absorption wavelength of 590 to 700 nm, at least one yellow dye having an absorption wavelength of 550 to 590 nm, and at least one blue dye having an absorption wavelength of 450 to 500 nm.

The polybenzoxazole precursor may include a repeating unit represented by the following Chemical Formula 1, or repeating units represented by the following Chemical Formulae 1 and 2, and may include a thermally polymerizable functional group at least one terminal end thereof.

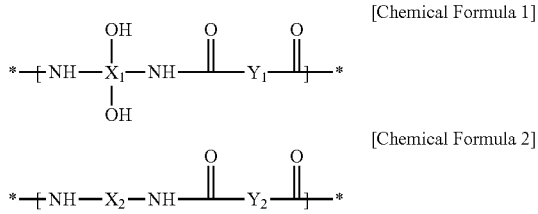

[Chemical Formula 1]

[Chemical Formula 2]

In Chemical Formulae 1 and 2, $X_1$ is an aromatic organic group, or a tetravalent to hexavalent aliphatic organic group, $Y_1$ and $Y_2$ are the same or different, and are independently an aromatic organic group or a divalent to hexavalent aliphatic organic group, and $X_2$ is an aromatic organic group, divalent to hexavalent aliphatic organic group, divalent to hexavalent alicyclic organic group, or an organic group represented by the following Chemical Formula 3,

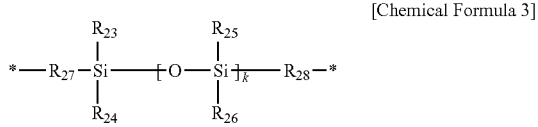

[Chemical Formula 3]

wherein, in Chemical Formula 3, $R_{23}$ to $R_{26}$ are the same or different, and are independently a substituted or unsubstituted alkyl group, a substituted or unsubstituted aryl group, a substituted or unsubstituted alkoxy group, or a hydroxy group, $R_{27}$ and $R_{28}$ are the same or different, and are independently a substituted or unsubstituted alkylene group, or a substituted or unsubstituted arylene group, and k is an integer ranging from 1 to 50.

The polyimide precursor may include repeating units represented by the following Chemical Formula 50 and the following Chemical Formula 51.

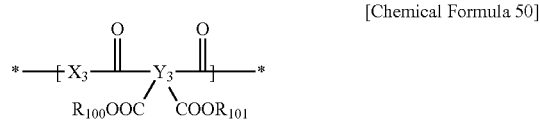

[Chemical Formula 50]

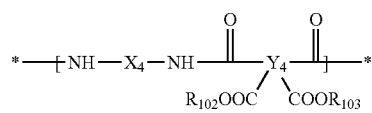

[Chemical Formula 51]

In Chemical Formulae 50 and 51, $X_3$ is an aromatic organic group, or divalent to hexavalent alicyclic organic groups, $Y_3$ and $Y_4$ are the same or different, and are independently an aromatic organic group, or tetravalent to hexavalent alicyclic organic groups, $X_4$ is an aromatic organic group, divalent to hexavalent alicyclic organic groups, or the functional group represented by the above Chemical Formula 3, and $R_{100}$ to $R_{103}$ are the same or different, and are independently hydrogen, or a substituted or unsubstituted C1 to C20 alkyl group.

The red dye having an absorption wavelength of 590 to 700 nm may include a compound selected from a xanthene-based compound, an azo-based compound, an anthraquinone-based compound, a cyan-based compound, and a combination thereof.

The yellow dye having an absorption wavelength of 550 to 590 nm may include a compound selected from a methane-based compound, an azo-based compound, or a combination thereof.

The blue dye having an absorption wavelength of 450 to 500 nm may include a compound selected from a triphenylmethane (TPM)-based compound, a triarylmethane (TAM)-based compound, a xanthene-based compound, and a combination thereof.

The red dye having an absorption wavelength of 590 to 700 nm may be a compound represented by the following Chemical Formula 4.

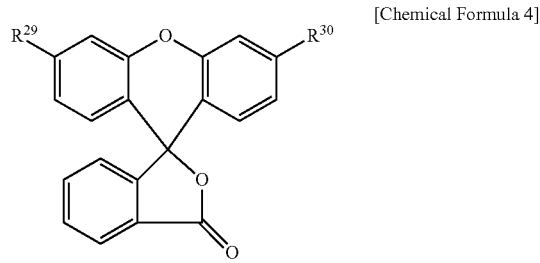

[Chemical Formula 4]

In Chemical Formula 4, $R^{29}$ and $R^{30}$ are the same or different, and are independently hydrogen, a substituted or unsubstituted amine group, or a substituted or unsubstituted C1 to C10 alkyl group.

The yellow dye having an absorption wavelength of 550 to 590 nm may be a compound represented by the following Chemical Formula 5.

[Chemical Formula 5]

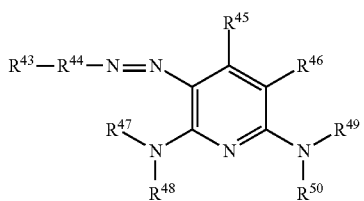

In Chemical Formula 5, $R^{43}$ is a substituted or unsubstituted C1 to C20 alkyl group, a C2 to C20 alkylaminoalkyl sulfonyl group, or a C1 to C20 alkyl group wherein at least one —$CH_2$— is replaced by —$SO_2$—, —O—, or —NR— (wherein R is hydrogen or a C1 to C6 alkyl group), $R^{44}$ is a substituted or unsubstituted C6 to C30 arylene group, or substituted or unsubstituted C2 to C30 heteroarylene group, $R^{45}$ and $R^{47}$ to $R^{50}$ are independently selected from hydrogen, a substituted or unsubstituted C1 to C20 alkyl group, a C1 to C20 alkyl group wherein at least one —$CH_2$— is replaced by —$SO_2$—, —O— or —NR— (wherein R is hydrogen or a C1 to C10 alkyl group), a substituted or unsubstituted C3 to C20 cycloalkyl group, a substituted or unsubstituted C2 to C20 alkenyl group, a substituted or unsubstituted C6 to C30 aryl group, a substituted or unsubstituted C2 to C30 heterocyclic group, a sulfonylalkyl group (—$SO_2R'$, wherein R' is hydrogen or a C1 to C10 alkyl group), a sulfonylaryl group (—$SO_2R''$, wherein R'' is a C6 to C16 aryl group), an acyl group, a carboxyl group, a sulfone group, and a carbamoyl group, and $R^{46}$ is selected from hydrogen, a halogen, and a cyano group.

The blue dye having an absorption wavelength of 450 to 500 nm may be a compound represented by the following Chemical Formula 6.

[Chemical Formula 6]

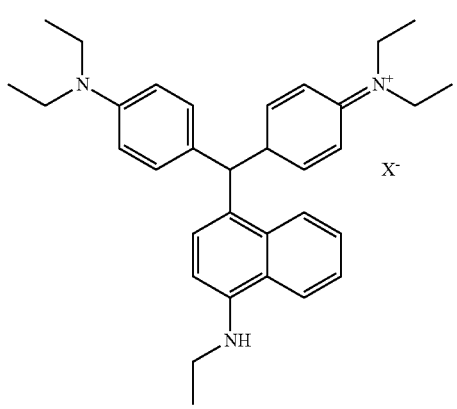

In Chemical Formula 6, $X^-$ is $F_3COO^-$, $CF_3SO_3^-$, $C_4F_9SO_3^-$, $(CF_3SO_2)_3C^-$, or $(CF_3SO_2)_2N^-$, for example $CF_3SO_3^-$.

The positive photosensitive resin composition may further include a silane compound.

The positive photosensitive resin composition may include 5 to 100 parts by weight of a photosensitive diazoquinone compound (B), 1 to 30 parts by weight of the phenol compound (C), 1 to 50 parts by weight of the organic dye (D); and 100 to 400 parts by weight of the solvent (E), based on 100 parts by weight of the alkali soluble resin (A).

According to another embodiment of the present invention, a photosensitive resin film fabricated using the positive photosensitive resin composition is provided.

According to a further embodiment of the present invention, a display device including the photosensitive resin film is provided.

Advantageous Effects

The positive photosensitive resin composition has excellent light shielding properties but does not deteriorate intrinsic properties of an insulation layer by preventing deterioration of insulating properties, pattern developability, and residue removal rate according to use of an inorganic pigment and organic pigment.

BEST MODE

Exemplary embodiments of the present invention will hereinafter be described in detail. However, these embodiments are only exemplary, and the present invention is not limited thereto.

As used herein, when specific definition is not otherwise provided, the term "alkyl group" refers to a C1 to C30 alkyl group, the term "cycloalkyl group" refer to a C3 to C30 cycloalkyl group, the term "heterocycloalkyl group" refers to a C2 to C30 heterocycloalkyl group, the term "aryl group" refers to a C6 to C30 aryl group, the term "heteroaryl group" refers to a C3 to C30 heteroaryl group, the term "arylalkyl group" refers to a C7 to C30 arylalkyl group, the term "alkylene group" refers to a C1 to C20 alkylene group, the term "alkoxylene group" referst to a C1 to C20 alkoxylene group, the term "arylene group" refers to a C6 to C30 arylene group, the term "heteroarylene group" refers to a C2 to C30 heteroarylene group, and the term "alkoxy group" refers to a C1 to C30 alkoxy group.

As used herein, when specific definition is not otherwise provided, the term "substituted" refers to one substituted with at least a substituent selected from a halogen (F, Cl, Br, or I), a hydroxy group, a nitro group, a cyano group, an imino group (=NH, =NR, R is a C1 to C10 alkyl group), an amino group —NH(R'), —N(R")(R'''), R' to R''' are each independently C1 to C10 alkyl group), an amidino group, a hydrazine group, a hydrazone group, a carboxyl group, a substituted or unsubstituted C1 to C30 alkyl group, a substituted or unsubstituted C6 to C30 aryl group, a substituted or unsubstituted C3 to C30 cycloalkyl group, a substituted or unsubstituted C3 to C30 heteroaryl group, and a substituted or unsubstituted C2 to C30 heterocycloalkyl group, instead of at least one hydrogen of a functional group.

As used herein, when a definition is not otherwise provided, the term "hetero" may refer to one including one to three heteroatoms selected from N, O, S, and P and remaining carbon, in a ring.

Also, "*" refers to a linking part between the same or different atoms, or chemical formulas.

According to one embodiment, a positive photosensitive resin composition includes (A) an alkali soluble resin selected from a polybenzoxazole precursor, a polyimide precursor, and a combination thereof; (B) a photosensitive diazoquinone compound, (C) a phenol compound, (D) an organic dye, and (E) a solvent, wherein the organic dye (D) includes at least one red dye having an absorption wavelength of 590 to 700 nm, at least one yellow dye having an absorption wavelength of 550 to 590 nm, and at least one blue dye having an absorption wavelength of 450 to 500 nm.

The organic dye (D) has excellent insulating and solubility, since the organic dye exists as particles in an organic solvent. Accordingly, a positive photosensitive resin composition including the organic dye has excellent light shielding effects, pattern-forming properties, and residue removal rate.

(A) Alkali Soluble Resin

The alkali soluble resin may be selected from a polybenzoxazole precursor, a polyimide precursor, and a combination thereof.

The polybenzoxazole precursor may include a repeating unit represented by the following Chemical Formula 1, or repeating units represented by the following Chemical Formulae 1 and 2, and may include a thermally polymerizable functional group at least one terminal end thereof.

[Chemical Formula 1]

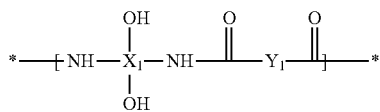

[Chemical Formula 2]

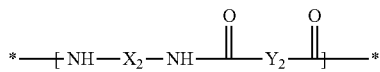

In Chemical Formulae 1 and 2, $X_1$ is an aromatic organic group, or a tetravalent to hexavalent aliphatic organic group, $Y_1$ and $Y_2$ are the same or different, and are independently an aromatic organic group or a divalent to hexavalent aliphatic organic group, $X_2$ is an aromatic organic group, divalent to hexavalent aliphatic organic group, divalent to hexavalent alicyclic organic group, or an organic group represented by the following Chemical Formula 3.

[Chemical Formula 3]

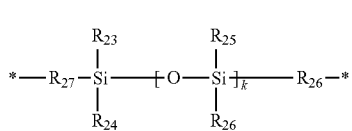

In Chemical Formula 3, $R_{23}$ to $R_{26}$ are the same or different, and are independently a substituted or unsubstituted alkyl group, a substituted or unsubstituted aryl group, a substituted or unsubstituted alkoxy group, or a hydroxy group, $R_{27}$ and $R_{28}$ are the same or different, and are independently a substituted or unsubstituted alkylene group, or a substituted or unsubstituted arylene group, k is an integer ranging from 1 to 50.

The polybenzoxazole precursor is not limited to a specific form, may be a random, block, or alternating copolymer.

When the polybenzoxazole precursor includes both repeating units represented by Chemical Formulae 1 and 2, the repeating unit represented by Chemical Formula 1 may be included at an amount of more than or equal to 60 mol % and less than 100 mol %.

$X^1$ may be a residual group derived from 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2'-bis(3-amino-4-hydroxy-5-trifluoromethylphenyl)hexafluoropropane, 2,2'-bis(3-amino-4-hydroxy-6-trifluoromethylphenyl)hexafluoropropane, 2,2'-bis(3-amino-4-hydroxy-2-trifluoromethylphenyl)hexafluoropropane, 2,2'-bis(4-amino-3-hydroxy-5-trifluoromethylphenyl)hexafluoropropane, 2,2'-bis(4-amino-3-hydroxy-6-trifluoromethylphenyl)hexafluoropropane, 2,2'-bis(4-amino-3-hydroxy-2-trifluoromethylphenyl)hexafluoropropane, 2,2'-bis(3-amino-4-hydroxy-5-pentafluoroethylphenyl)hexafluoropropane, 2-(3-amino-4-hydroxy-5-trifluoromethylphenyl)-2'-(3-amino-4-hydroxy-5-pentafluoroethylphenyl)hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl)hexafluoropropane, 2-(3-amino-4-hydroxy-5-trifluoromethylphenyl)-2'-(3-hydroxy-4-amino-2-trifluoromethylphenyl)hexafluoropropane, 2-(3-amino-4-hydroxy-2-trifluoromethylphenyl)-2'-(3-hydroxy-4-amino-5-trifluoromethylphenyl)hexafluoropropane, 2-(3-amino-4-hydroxy-6-trifluoromethylphenyl)-2'-(3-hydroxy-4-amino-5-trifluoromethylphenyl)hexafluoropropane, 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, and a combination thereof, but is not limited thereto.

$X_1$ may include a functional group represented by the following Chemical Formulae 7 and 8.

[Chemical Formula 7]

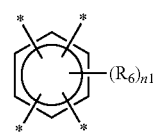

[Chemical Formula 8]

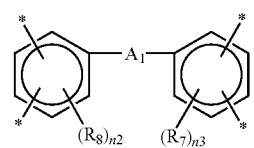

In Chemical Formulae 7 and 8, $A_1$ is selected from O, CO, $CR_8R_9$, $SO_2$, S, and a single bond, $R_8$ and $R_9$ are the same or different, and are independently selected from hydrogen and a substituted or unsubstituted alkyl group, and preferably the $R_8$ and $R_9$ are a fluoroalkyl group, $R_5$ to $R_7$ are the same or different, and are independently selected from hydrogen, a substituted or unsubstituted alkyl group, a hydroxy group, a carboxylic acid group, and a thiol group, $n_1$ is an integer of 1 to 2, and $n_2$ and $n_3$ are the same or different, and are independently an integer of 1 to 3.

$X^2$ may be a residual group derived from aromatic diamine, alicyclic diamine, or silicon diamine.

Examples of the aromatic diamine may include 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4- aminophenoxy)biphenyl, bis[4-(4-aminophenoxy)phenyl] ether, 1,4-bis(4-aminophenoxy)benzene or a combination thereof, but are not limited thereto. The aromatic diamine may be used singularly or as a mixture thereof.

Examples of the silicon diamine may include bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, but are not limited thereto.

Examples of the alicyclic diamine may include cyclohexyldiamine, methylenebiscyclohexylamine, and the like, but are not limited thereto.

The alicyclic diamine may be used singularly or as a mixture thereof, and the aromatic diamine, silicon diamine, or alicyclic diamine may be mixed in an appropriate ratio.

$Y_1$ and $Y_2$ may be a residual group derived from a dicarboxylic acid or a residual group derived from a dicarboxylic acid derivative.

Examples of the dicarboxylic acid include $Y(COOH)_2$ (wherein Y is the same as $Y_1$ and $Y_2$).

Examples of the dicarboxylic acid derivative include a carbonyl halide derivative or an active compound of an active ester derivative obtained by reacting $Y(COOH)_2$ with 1-hydroxy-1,2,3-benzotriazole Specific examples of the dicarboxylic acid derivative includes a compound selected from 4,4'-oxydibenzoylchloride, diphenyloxydicarboxylic acid chloride, bis(phenylcarboxylic acid chloride)sulfone, bis(phenylcarboxylic acid chloride)ether, bis(phenylcarboxylic acid chloride)phenone, phthalic carboxylic acid dichloride, terephthalic acid dichloride, isophthalic carboxylic acid dichloride, carboxylic acid dichloride, diphenyloxydicarboxylate benzotriazole and a combination thereof.

$Y_1$ and $Y_2$ may be functional groups represented by the following Chemical Formulae 9 to 11.

[Chemical Formula 9]

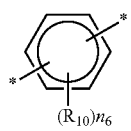

[Chemical Formula 10]

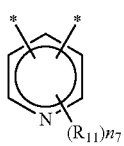

[Chemical Formula 11]

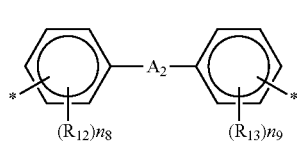

In Chemical Formulae 9 to 11, $R_{10}$ to $R_{13}$ are the same or different, and are independently selected from hydrogen, or substituted or unsubstituted alkyl group, $n_6$, $n_8$ and $n_9$ are the same or different, and are independently an integer of 1 to 4, $n_7$ is an integer of 1 to 3, $A_2$ is O, $CR_{14}R_{15}$, CO, CONH, S, or $SO_2$, wherein $R_{14}$ and $R_{15}$ are the same or different, and are independently, hydrogen, a substituted or unsubstituted alkyl group, or a fluoroalkyl group.

The polybenzoxazole precursor may include a thermally polymerizable functional group derived from reactive end-capping monomer at least one terminal end of branched chain of the polybenzoxazole precursor.

The reactive end-capping monomer may include monoamines including double bonds or monoanhydrides including double bonds, or a combination thereof.

Examples of the monoamines including double bonds may include toluidine, dimethylaniline, ethylaniline, aminophenol, aminobenzyl alcohol, aminoindan, aminoacetophenone, or a combination thereof, but are not limited thereto.

Examples of the monoanhydrides including the double bond may include 5-norbornene-2,3-dicarboxylanhydride represented by the following Chemical Formula 12, 3,6-epoxy-1,2,3,6-tetrahydrophthalic anhydride represented by the following Chemical Formula 13, or isobutenyl succinic anhydride represented by the following Chemical Formula 14, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), or a combination thereof, but are not limited thereto.

[Chemical Formula 12]

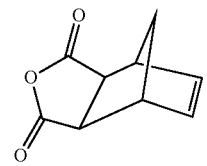

[Chemical Formula 13]

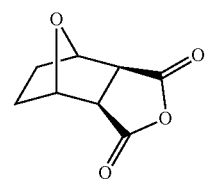

[Chemical Formula 14]

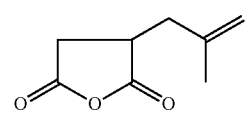

The following Chemical Formulas 15 to 19 are examples of the thermally polymerizable functional group that is positioned at the terminal end of the polybenzoxazole precursor, and the thermally polymerizable functional group may be cross-linked during heating process of the polybenzoxazole precursor preparation process.

[Chemical Formula 15]

In Chemical Formula 15, $R_{16}$ is H, $CH_2COOH$, or $CH_2CHCHCH_3$.

[Chemical Formula 16]

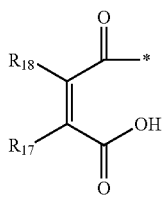

In Chemical Formula 16, $R_{17}$ and $R_{18}$ are the same or different, and are independently selected from H or $CH_3$.

[Chemical Formula 17]

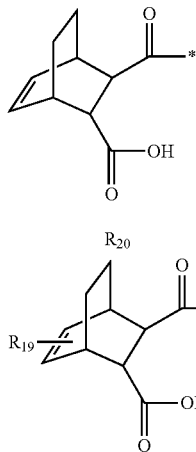

[Chemical Formula 18]

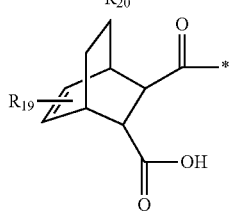

In Chemical Formula 18, $R_{19}$ is H or $CH_3$, and $R_{20}$ is $CH_2$ or oxygen.

[Chemical Formula 19]

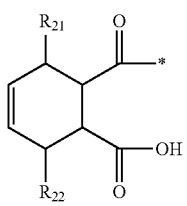

In Chemical Formula 19, $R_{21}$ and $R_{22}$ are the same or different, and are independently, H, $CH_3$, or $OCOCH_3$.

The polybenzoxazole precursor has a weight average molecular weight (Mw) ranging from 3,000 to 300,000. When the polybenzoxazole precursor has a weight average molecular weight within the range, sufficient physical properties and excellent solubility to the organic solvent may be provided.

The polyimide precursor may further include repeating unit represented by the following Chemical Formulae 50 and 51. The repeating unit represented by following Chemical Formula 50 enables rapid resin curing at a high temperature, and the repeating unit represented by the following Chemical Formula 51 improves thermal properties when being cured at a high temperature.

[Chemical Formula 50]

[Chemical Formula 51]

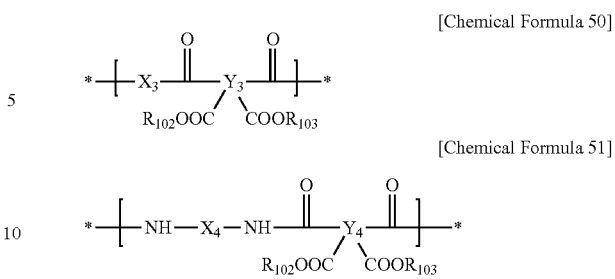

In Chemical Formulae 50 to 51, $X_3$ is an aromatic organic group, or divalent to hexavalent alicyclic organic groups, $Y_3$ and $Y_4$ are the same or different, and are independently an aromatic organic group, or tetravalent to hexavalent alicyclic organic groups, $X_4$ is an aromatic organic group, divalent to hexavalent alicyclic organic groups, or the functional group represented by the above Chemical Formula 3, $R_{100}$ to $R_{103}$ are the same or different, and are independently hydrogen, or a substituted or unsubstituted C1 to C20 alkyl group.

In the positive photosensitive resin composition, based on the sum, 100 mol % of the repeating unit represented by the above Chemical Formula 50 and the repeating unit represented by the above Chemical Formula 51, the repeating unit represented by the above Chemical Formula 50 and the repeating unit represented by the above Chemical Formula 501 may be included in an amount of 5 mol % to 50 mol % and 50 mol % to 95 mol %, respectively.

The polyimide precursor may have a weight average molecular weight (Mw) of 3,000 to 300,000.

(B) Photosensitive Diazoquinone Compound

The photosensitive diazoquinone compound may be a compound including a 1,2-benzoquinone diazide or 1,2-naphtoquinone diazide structure.

The photosensitive diazoquinone compound may include the compounds represented by the following Chemical Formulae 22 to 24, but is not limited thereto.

[Chemical Formula 20]

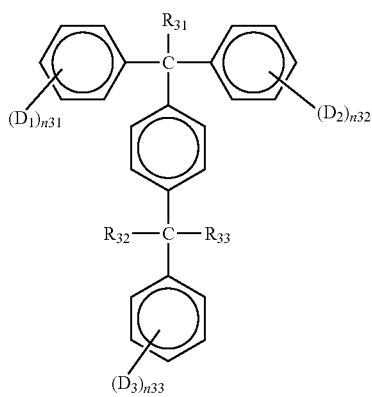

In Chemical Formula 20,
$R_{31}$ to $R_{33}$ are the same or different, and are independently, hydrogen, or a substituted or unsubstituted alkyl group, and preferably $CH_3$,
$D_1$ to $D_3$ are the same or different and are independently OQ, wherein Q is hydrogen, or the following Chemical Formula 21a or 21b, provided that Q is not simultaneously hydrogen, and $n_{31}$ to $n_{33}$ are the same or different, and are independently an integer ranging from 1 to 3.

[Chemical Formula 21a]

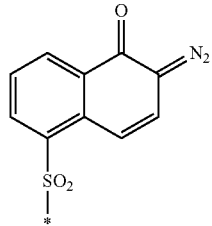

[Chemical Formula 21b]

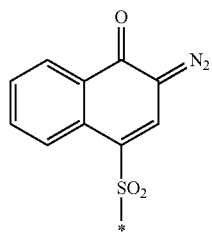

[Chemical Formula 22]

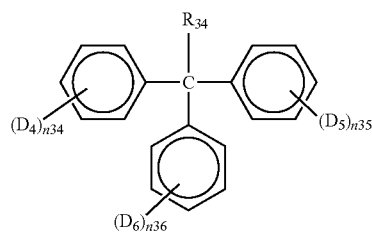

In Chemical Formula 22, $R_{34}$ is hydrogen, or a substituted or unsubstituted alkyl group, $D_4$ to $D_6$ are OQ, wherein Q is the same as defined in Chemical Formula 20, and $n_{34}$ to $n_{36}$ are the same or different and are independently an integer ranging from 1 to 3.

[Chemical Formula 23]

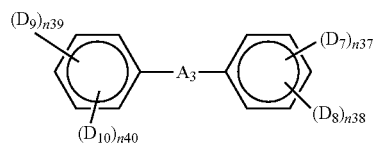

In Chemical Formula 23, $A_3$ is CO or CRR', wherein R and R' are the same or different and are independently a substituted or unsubstituted alkyl group, $D_7$ to $D_{10}$ are the same or different and are independently hydrogen, a substituted or unsubstituted alkyl group, OQ, or NHQ, wherein Q is the same as defined in Chemical Formula 20, $n_{37}$, $n_{38}$, $n_{39}$ and $n_{40}$ are the same or different, and are independently an integer ranging from 1 to 4, $n_{37}+n_{38}$ and $n_{39}+n_{40}$ are each independently an integer of less than or equal to 5, provided that at least one of $D_7$ to $D_8$ is OQ, and one aromatic ring includes one to three OQs and the other aromatic ring includes one to four OQs.

[Chemical Formula 24]

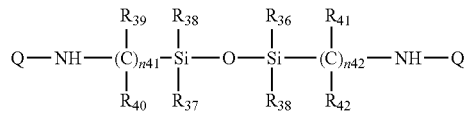

In Chemical Formula 24, $R_{35}$ to $R_{42}$ are the same or different and are independently hydrogen, or a substituted or unsubstituted alkyl group, $n_{41}$ and $n_{42}$ are the same or different and are independently an integer of 1 to 5, and preferably 2 to 4, Q is the same as defined in Chemical Formula 20.

The photosensitive diazoquinone compound may be included in an amount of 5 to 100 parts by weight based on 100 parts by weight of the polybenzoxazole precursor. When the amount of the photosensitive diazoquinone compound is within the range, the pattern is well-formed without a residue from exposure, and a film thickness loss during development can be prevented and thereby a good pattern is provided.

(C) Phenol compound

The phenol compound increases a dissolution rate and sensitivity of exposed parts during development using an alkali aqueous solution, and plays a role of forming high resolution patterns.

Such a phenol compound includes 2,6-dimethoxymethyl-4-t-butylphenol, 2,6-dimethoxymethyl-p-cresol, 2,6-diacetoxymethyl-p-cresol, and the like, but is not limited thereto.

The phenol compound may be a compound represented by the following Chemical Formulas 25 to 30, but is not limited thereto.

[Chemical Formula 25]

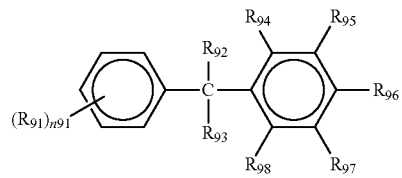

In Chemical Formula 25, $R_{91}$ to $R_{93}$ are the same or different and are independently hydrogen, or a substituted or unsubstituted alkyl group, $R_{94}$ to $R_{98}$ are the same or different and are independently H, OH, or a substituted or unsubstituted alkyl group, and the alkyl group may be $CH_3$, and $n_{91}$ is an integer of 1 to 5.

[Chemical Formula 26]

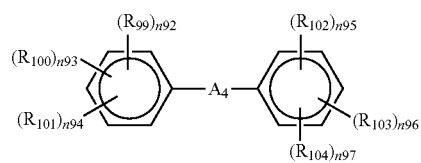

In Chemical Formula 26, $R_{99}$ to $R_{104}$ are the same or different and are independently H, OH, or a substituted or unsubstituted alkyl group, $A_4$ is CR'R" or a single bond, wherein R' and R" are the same or different and are independently hydrogen, or a substituted or unsubstituted alkyl group, and preferably the alkyl group may be $CH_3$, and $n_{92}+n_{93}+n_{94}$ and $n_{95}+n_{96}+n_{97}$ are the same or different and are independently less than or equal to 5.

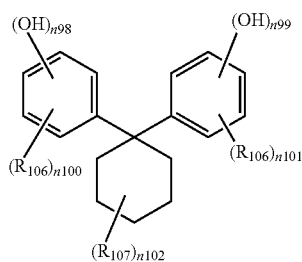

[Chemical Formula 27]

In Chemical Formula 27, $R_{105}$ to $R_{107}$ are the same or different and are independently hydrogen, or a substituted or unsubstituted alkyl group, $n_{98}$, $n_{99}$ and $n_{102}$ are the same or different and are independently integers of 1 to 5, and $n_{100}$ and $n_{101}$ are the same or different and are independently integers of 0 to 4.

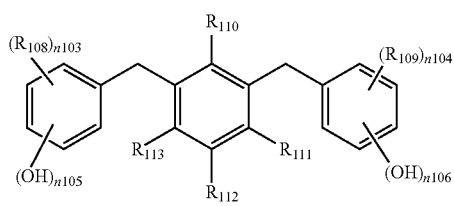

[Chemical Formula 28]

In Chemical Formula 28, $R_{108}$ to $R_{113}$ are the same or different and are independently hydrogen, OH, or a substituted or unsubstituted alkyl group, $n_{103}$ to $n_{106}$ are the same or different and are independently integers ranging from 1 to 4, and $n_{103}+n_{105}$ and $n_{104}+n_{106}$ are independently integers of less than or equal to 5.

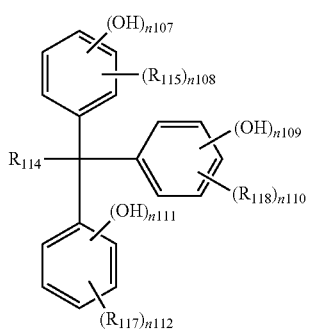

[Chemical Formula 29]

In Chemical Formula 29, $R_{114}$ is a substituted or unsubstituted alkyl group, preferably $CH_3$, $R_{115}$ to $R_{117}$ are the same or different and are independently hydrogen, or a substituted or unsubstituted alkyl group, $n_{107}$, $n_{109}$, and $n_{111}$ are the same or different and are independently integers of 1 to 5, $n_{108}$, $n_{110}$ and $n_{112}$ are the same or different and are independently integers of 0 to 4, and $n_{107}+n_{108}$, $n_{109}+n_{110}$ and $n_{111}+n_{112}$ are independently integers of less than or equal to 5.

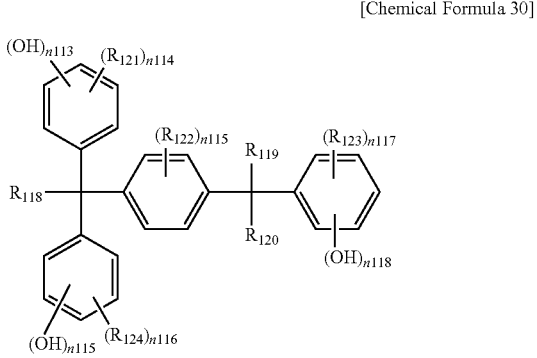

[Chemical Formula 30]

In Chemical Formula 30, $R_{118}$, $R_{119}$ and $R_{120}$ are the same or different, and are independently a substituted or unsubstituted alkyl group, and preferably $CH_3$, $R_{121}$ to $R_{124}$ are the same or different, and are independently hydrogen, or a substituted or unsubstituted alkyl group, $n_{113}$, $n_{115}$, and $n_{118}$ are the same or different, and are independently integers of 1 to 5, $n_{114}$, $n_{116}$, and $n_{117}$ are the same or different, and are independently integers of 0 to 4, $n_{119}$ is an integer of 1 to 4, and $n_{113}+n_{114}$, $n_{115}+n_{116}$ and $n_{117}+n_{118}$ are independently integers of less than or equal to 5.

The phenol compound may be included in an amount of about 1 to about 30 parts by weight based on 100 parts by weight of the polybenzoxazole precursor. When the phenol compound is included within the range, sensitivity during development may be improved, and the dissolubility of the non-exposed part may be suitably increased to provide a good pattern. In addition, precipitation during freezing does not occur, so excellent storage stability may be realized.

(D) Organic Dye

The organic dye (D) includes at least one red dye having an absorption wavelength of 590 to 700 nm, at least one yellow dye having an absorption wavelength of 550 to 590 nm, and at least one blue dye having an absorption wavelength of 450 to 500 nm.

The organic dye may realize a black color having light shielding properties due to three or more kinds of the organic dyes having the above absorption wavelengths.

In one embodiment, the red dye having an absorption wavelength of 590 to 700 nm may be a red dye having an absorption wavelength of 610 to 700 nm. Specifically, the red dye may be selected from a xanthene-based compound, an azo-based compound, an anthraquinone-based compound, a cyan-based compound, and a combination thereof. The red dye having an absorption wavelength of 590 to 700 nm may be dyes listed in the color index.

In one embodiment, the yellow dye having an absorption wavelength of 550 to 590 nm may include a compound selected from a methane-based compound, an azo-based compound, or a combination thereof.

The yellow dye having an absorption wavelength of 570 to 590 nm may be dyes listed in the color index.

In one embodiment, the blue dye having an absorption wavelength of 450 to 500 nm may be selected from a triphenylmethane (TPM)-based compound, a triarylmethane (TAM)-based compound, a xanthene-based compound, and a combination thereof. The blue dye having an absorption wavelength of 450 to 500 nm may be dyes listed in the color index.

The positive photosensitive resin composition may include three or more kinds of organic dyes having the above absorption wavelengths, for example a combination of a red dye, a yellow dye, and a blue dye, or a combination of a red dye, a blue dye, and a green dye.

In this way, since the positive photosensitive resin composition includes three or more kinds of the organic dyes different from one another, the organic dyes may accomplish excellent light shielding properties in a smaller amount than an organic pigment. In addition, the positive photosensitive resin composition has good insulating properties and thus, may be appropriately used for a semiconductor device requiring high insulating properties such as an insulation layer for an emitting element and the like. Accordingly, the positive photosensitive resin composition including the organic dye may simultaneously solve both insulating properties of an inorganic pigment and pattern developability and residue removal rate deterioration of an organic pigment.

The organic dye exists in a particle phase rather than a dispersion phase in a solvent compared with an organic pigment, and thus does not damage a surface morphology of a film.

In one embodiment, the red dye having an absorption wavelength of 590 to 700 nm may be a compound represented by the following Chemical Formula 4.

[Chemical Formula 4]

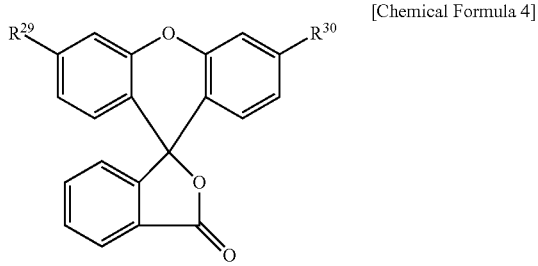

In Chemical Formula 4, $R^{29}$ and $R^{30}$ are the same or different, and are independently hydrogen, a substituted or unsubstituted amine group or a substituted or unsubstituted C1 to C10 alkyl group, for example, a methyl group, a propyl group or $-NEt_2$.

The above Chemical Formula 4 may be represented by the following Chemical Formula 4a.

[Chemical Formula 4a]

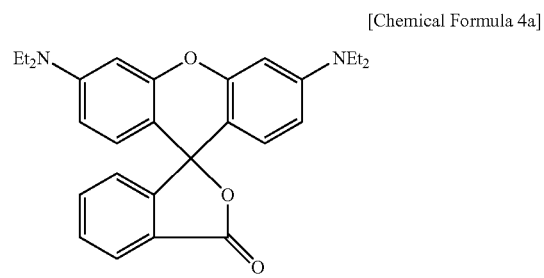

In one embodiment, the yellow dye having an absorption wavelength of 550 to 590 nm may be a compound represented by the following Chemical Formula 5.

[Chemical Formula 5]

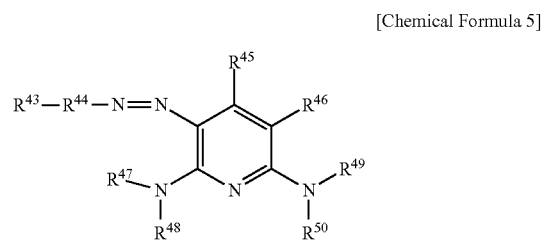

In Chemical Formula 5, $R^{43}$ is a substituted or unsubstituted C1 to C20 alkyl group, a C2 to C20 alkylaminoalkyl sulfonyl group, or a C1 to C20 alkyl group wherein at least one $-CH_2-$ is replaced by $-SO_2-$, $-O-$, or $-NR-$ (wherein R is hydrogen or a C1 to C6 alkyl group), $R^{44}$ is a substituted or unsubstituted C6 to C30 arylene group, or substituted or unsubstituted C2 to C30 heteroarylene group, $R^{45}$ and $R^{47}$ to $R^{50}$ are independently selected from hydrogen, a substituted or unsubstituted C1 to C20 alkyl group, a C1 to C20 alkyl group wherein at least one $-CH_2-$ is replaced by $-SO_2-$, $-O-$ or $-NR-$ (wherein R is hydrogen or a C1 to C10 alkyl group), a substituted or unsubstituted C3 to C20 cycloalkyl group, a substituted or unsubstituted C2 to C20 alkenyl group, a substituted or unsubstituted C6 to C30 aryl group, a substituted or unsubstituted C2 to C30 heterocyclic group, a sulfonylalkyl group ($-SO_2R'$, wherein R' is hydrogen or a C1 to C10 alkyl group), a sulfonylaryl group ($-SO_2R''$, wherein R'' is a C6 to C16 aryl group), an acyl group, a carboxyl group, a sulfone group, and a carbamoyl group, and $R^{46}$ is selected from hydrogen, a halogen, and a cyano group.

The above Chemical Formula 5 may be represented by the following
Chemical Formula 5a.

[Chemical Formula 5a]

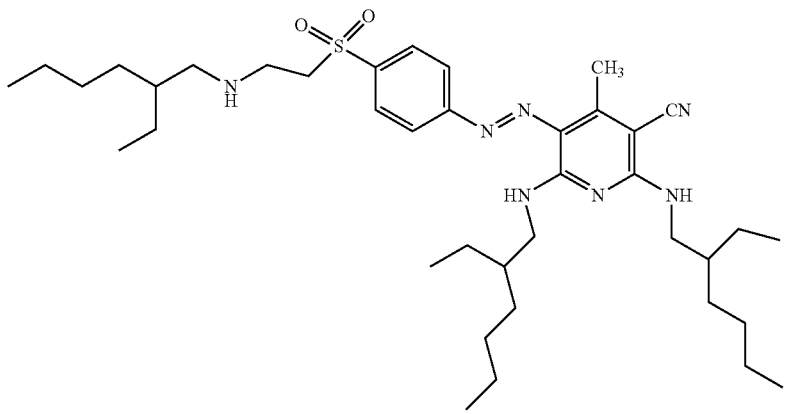

In one embodiment, the blue dye having an absorption wavelength of 450 to 500 nm may be a compound represented by the following Chemical Formula 6.

[Chemical Formula 6]

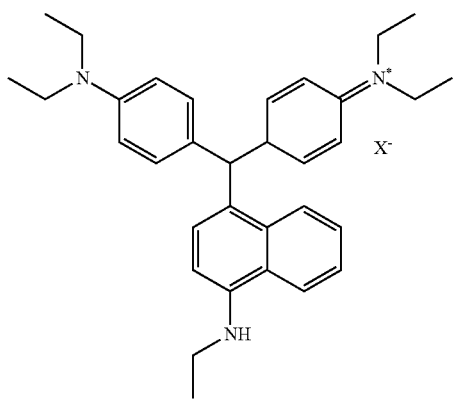

In Chemical Formula 6, $X^-$ is $F_3COO^-$, $CF_3SO_3^-$, $C_4F_9SO_3^-$, $(CF_3SO_2)_3C^-$, or $(CF_3SO_2)_2N^-$, for example $CF_3SO_3^-$.

The organic dye may be included in an amount of 1 to 50 parts by weight, and preferably 10 to 20 parts by weight based on 100 parts by weight of the alkali soluble resin. When the organic dye is used within the above numeral ranges, the photosensitive resin composition may prevent residue ratios, sensitivity, and the like of the film from being deteriorated and thus, improve luminance of the film.

The organic dye may have solubility of 1 to 10 wt % for a solvent. Within the above numeral ranges, precipitation of the dye in the photosensitive resin composition may be prevented. The organic dye may have solubility of 1 to 10 wt % for a solvent selected from N-methyl-2-pyrrolidone, γ-butyrolactone, N,N-dimethyl acetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, cyclohexanone, and the like. In this case, precipitation of the organic dye may be prevented, and good pattern-forming properties may be obtained.

The photosensitive resin composition may include one or more highly durable dye along with the organic dye. The highly durable may be a dye that has a small particle size and exists in a particle phase rather than a dispersion phase, and thus does not damage a surface morphology of a film. The highly durable dye may be one or more selected from a direct dye, an acidic dye, a basic dye, an acidic mordant dye, a sulfur dye, a reduction dye, an azoic dye, a dispersion dye, a reactive dye, an oxidation dye, an alcohol-soluble dye, an azo dye, an anthraquinone dye, an indigoid dye, a carbonium ion dye, a phthalocyanine dye, a nitro dye, a quinoline dye, a cyanine dye, and a polyxanthene dye. Such a highly durable dye may be included in an amount of 1 to 50 pars by weight based on 100 parts by weight of the alkali soluble resin.

(E) Solvent

The solvent may be an organic solvent, for example N-methyl-2-pyrrolidone, gamma-butyrolactone, N,N-dimethyl acetamide, dimethylsulfoxide, diethyleneglycoldimethylether, diethyleneglycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like, but is not limited thereto. The solvent may be used singularly or as a mixture.

The solvent may be included in an amount of 100 to 400 parts by weight based on 100 parts by weight of the alkali soluble resin. When the solvent is included in the above amount, a film of a sufficient thickness may be coated, and solubility and coating properties may be improved.

(F) Silane Compound

The photosensitive resin composition may further (E) silane compound along with the (A) to (D), to improve adherence with a substrate.

The silane compound may be represented by the following Chemical Formula 31.

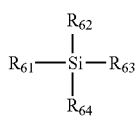

[Chemical Formula 31]

In Chemical Formula 31, $R_{61}$ is a vinyl group, a substituted or unsubstituted alkyl group, or a substituted or unsubstituted aryl group, and preferably 3-(methacryloxy)propyl, p-styryl, or 3-(phenylamino) propyl.

$R_{62}$ to $R_{64}$ are the same or different, and are independently a substituted or unsubstituted alkoxy group, a substituted or unsubstituted alkyl group, or a halogen, wherein at least one of the $R_{62}$ to $R_{64}$ is an alkoxy group or a halogen, and the alkoxy group may be preferably a C1 to C8 alkoxy group, the alkyl group may be a C1 to C20 alkyl group.

The silane compound may include a compound represented by the following Chemical Formula 32 or 33; an aryl group-containing silane compound such as trimethoxy[3-(phenylamino)propyl]silane and the like; a carbon-carbon unsaturated-containing silane compound such as vinyltrimethoxysilane, vinyltriethoxysilane, vinyl trichlorosilane, vinyltris(β-methoxyethoxy)silane; or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane, and the like. In one embodiment, vinyltrimethoxysilane, or vinyltriethoxysilane may be preferable.

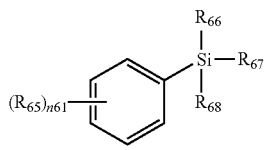

[Chemical Formula 32]

In Chemical Formula 32, $R_{65}$ is $NH_2$ or $CH_3CONH$, $R_{66}$ to $R_{68}$ are the same or different and are independently a substituted or unsubstituted alkoxy group, and preferably the alkoxy group may be $OCH_3$ or $OCH_2CH_3$, and $n_{61}$ is an integer of 1 to 5.

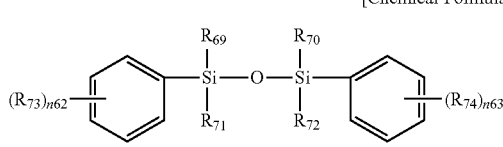

[Chemical Formula 33]

In Chemical Formula 33, $R_{69}$ to $R_{72}$ are the same or different and are independently a substituted or unsubstituted alkyl group, or a substituted or unsubstituted alkoxy group, and preferably $CH_3$ or $OCH_3$, $R_{73}$ and $R_{74}$ are the same or different, and are independently a substituted or unsubstituted amino group, and specifically $NH_2$ or $CH_3CONH$, and $n_{62}$ and $n_{63}$ are the same or different, and are independently an integer of 1 to 5.

The silane compound may be used in an amount of 0.1 to 30 parts by weight based on 100 parts by weight of the alkali soluble resin. When the silane compound is included within the range, a film has excellent adherence to upper and lower layers and no residue after development, and improved mechanical properties such as optical properties (transmittance) and tensile strengths, elongation rates, Young's modulus, and the like.

(F) Other Additive

The positive photosensitive resin composition may further include other additive (G) besides the above-described (A) to (D) components.

The other additives include a latent thermal acid generator. The latent thermal acid generator includes an arylsulfonic acid such as p-toluenesulfonic acid, benzenesulfonic acid, and the like; a perfluoroalkylsulfonic acid such as trifluoromethanesulfonic acid, trifluorobutanesulfonic acid, and the like; an alkylsulfonic acid such as methanesulfonic acid, ethanesulfonic acid, butanesulfonic acid, and the like; or a combination thereof, but is not limited thereto.

The latent thermal acid generator is a catalyst for a dehydration reaction and a cyclization reaction of the polybenzoxazole precursor that is polyamide including a phenolic hydroxy group, and thus a cyclization reaction may be performed smoothly even if a curing temperature is decreased.

In addition, the positive photosensitive resin composition may further include an additive such as a suitable surfactant or leveling agent to prevent a stain of the film or to improve the development.

A black organic pigment and a black inorganic pigment may be further used in order to improve light shielding performance. The black organic pigment may include perylene black (K0084, K0086, made by BASF), cyanine black, and the like. The black organic pigment may be used singularly or as a mixture thereof. The inorganic pigment may include carbon black (PRIN TEX-U, made by Degussa), chromium oxide, iron oxide, titan black, and the like.

The process for forming a pattern using the positive photosensitive resin composition according to one embodiment includes: coating a positive photosensitive resin composition on a supporting substrate; drying the coated positive photosensitive resin composition to provide a positive a photosensitive polybenzoxazole precursor layer; exposing the polybenzoxazole precursor layer; developing the exposed polybenzoxazole precursor layer with an alkali aqueous solution to provide a photosensitive resin film; and baking photosensitive resin film. The process of providing a pattern including the coating, exposing, and developing processes are widely known in this art, so detailed descriptions thereof will be omitted in this specification.

According to another embodiment of the present invention, a photosensitive resin film fabricated using the positive photosensitive resin composition is provided. The photosensitive resin film may be applied to an insulation layer, a buffer layer, or a protective layer.

According to further another embodiment of the present invention, a display device including the photosensitive resin film is provided. The display device may be ㅌ organic light emitting diode (OLED) or liquid crystal display (LCD).

Mode for Invention

The following examples illustrate the present invention in more detail. However, it is understood that the present invention is not limited by these examples.

Synthesis Example 1

Synthesis of Polybenzoxazole Precursor (PBO-A)

41.1 g of 2,6-bis[[[5-[1-(amino-4-hydroxyphenyl)-2,2,2-trifluoro-1-(trifluoromethyl)ethyl]-2-hydroxyphenyl]amino]

methyl]-4-methylphenol was dissolved in 280 g of N-methyl-2-pyrrolidone (NMP) in a four-necked flask mounted with an agitator, a temperature controlling device, a nitrogen gas injector, and a condenser while nitrogen was passed therethrough. When a solid was completely dissolved, 9.9 g of pyridine was added to the solution. The mixture was maintained at a temperature ranging from 0 to 5° C., and a solution prepared by dissolving 13.3 g of 4,4'-oxydibenzoylchloride in 142 g of N-methyl-2-pyrrolidone (NMP) was slowly added thereto in a dropwise fashion for 30 minutes. The resulting mixture was reacted for 1 hour at 0° C. to 5° C. and increased its temperature from 0 to 5° C. to room temperature and then, agitated for one hour, completing the reaction.

Herein, 1.6 g of 5-norbornene-2,3-dicarboxylanhydride was added to the reactant. The mixture was agitated at 70° C. for 24 hours, completing the reaction. The reaction mixture was added to a solution prepared by mixing water/methanol in a volume ratio of 10/1 to produce a precipitate. The precipitate was filtrated, sufficiently rinsed with water, and dried at 80° C. under vacuum for 24 hours, preparing a polybenzoxazole precursor (PBO-A) having a weight average molecular weight of 9,500.

Example 1

100 parts by weight of the polybenzoxazole precursor (PBO-A) according to Synthesis Example 1 was added to 350 parts by weight of γ-butyrolactone (GBL), and 10 parts by weight of photosensitive diazoquinone having a structure of the following Chemical Formula 34, 0.2 parts by weight of trimethoxy[3-(phenylamino)propyl]silane represented by the following Chemical Formula 35, and 7.5 parts by weight of a phenol compound represented by the following Chemical Formula 36 were added thereto and dissolved therein, obtaining a resin mixture.

Then, 5 parts by weight of a xanthene-based red dye represented by the following Chemical Formula 4a (Solvent Red49, Chemblink), 3 parts by weight of a triphenylmethane (TPM)-based blue dye represented by the following Chemical Formula 5a (SB11001, Cheil Industries Inc.), and 2 parts by weight of a diaminopyridine azo-based yellow dye represented by the following Chemical Formula 6a (CF Yellow 100108, Kyung-In Synthetic Corporation) were dissolved in cyclohexanone. The solution was added to the resin mixture. The resulting mixture was agitated and stabilized for 3 hours at room temperature and then, filtered with a 0.45 μm fluorine resin, preparing a positive photosensitive resin composition.

[Chemical Formula 34]

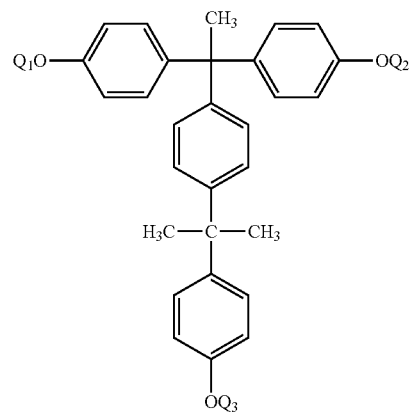

In Chemical Formula 34, two of $Q_1$, $Q_2$ and $Q_3$ are

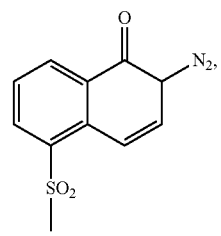

and the remaining group is hydrogen.

[Chemical Formula 35]

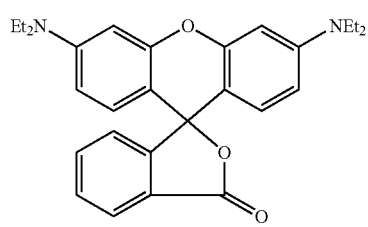

[Chemical Formula 36]

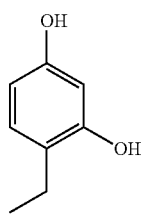

[Chemical Formula 4a]

[Chemical Formula 5a]

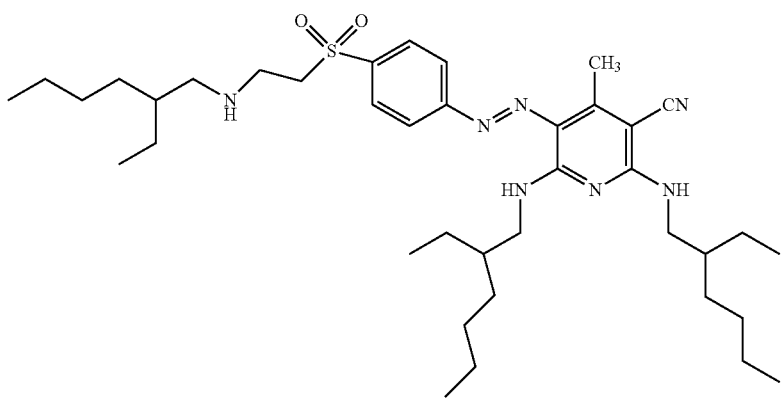

[Chemical Formula 6a]

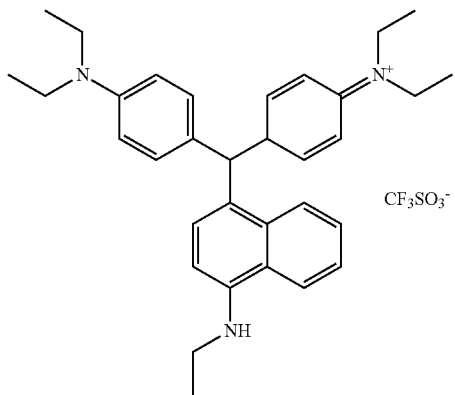

Examples 2 to 4

Each positive photosensitive resin composition was respectively prepared according to the same method as Example 1 except for using components described in the aforementioned 1.

Comparative Example 1

A positive photosensitive resin composition was prepared according to the same method as Example 1 except for using a xanthene-based red dye represented by the above Chemical Formula 4a (Solvent Red49, Chemblink), a triphenylmethane (TPM)-based blue dye represented by the above Chemical Formula 5a (SB11001, Cheil Industries Inc.), and a diaminopyridine azo-based yellow dye represented by the above Chemical Formula 6a (CF Yellow 100108, Kyung-In Synthetic Corporation).

Comparative Example 2

A positive photosensitive resin composition was prepared according to the same method as Example 1 by using 10 parts by weight of a black organic pigment K00847 (BASF) instead of a xanthene-based red dye represented by the above Chemical Formula 4a (Solvent Red49, Chemblink), a triphenylmethane (TPM)-based blue dye represented by the above Chemical Formula 5a (SB11001, Cheil Industries Inc.), and a diaminopyridine azo-based yellow dye represented by the above Chemical Formula 6a (CF Yellow 100108, Kyung-In Synthetic Corporation).

Comparative Example 3

A positive photosensitive resin composition was prepared according to the same method as Example 1 by using 10 parts by weight of an inorganic pigment PRIN TEX-U (made by Degussa) instead of a xanthene-based red dye represented by the above Chemical Formula 4a (Solvent Red49, Chemblink), a triphenylmethane (TPM)-based blue dye represented by the above Chemical Formula 5a (SB11001, Cheil Industries Inc.), and a diaminopyridine azo-based yellow dye represented by the above Chemical Formula 6a (CF Yellow 100108, Kyung-In Synthetic Corporation).

TABLE 1

| Raw material | Amount (g) | | | | | | |
|---|---|---|---|---|---|---|---|
| | Ex. 1 | Ex. 2 | Ex. 3 | Ex. 4 | Comp. Ex. 1 | Comp. Ex. 2 | Comp. Ex. 3 |
| PBO precursor | 100 | 100 | 100 | 100 | 100 | 100 | 100 |
| Diazoquinone compound | 10 | 10 | 10 | 10 | 10 | 10 | 10 |
| Silane compound | 0.2 | 0.2 | 0.2 | 0.2 | 0.2 | 0.2 | 0.2 |
| Phenol compound | 7.5 | 7.5 | 7.5 | 7.5 | 7.5 | 7.5 | 7.5 |
| PGME | 250 | 250 | 250 | 250 | 250 | 250 | 250 |
| GBL | 100 | 100 | 100 | 100 | 100 | 100 | 100 |
| Red dye | 5 | 10 | 15 | 25 | 0 | — | — |
| Blue dye | 3 | 6 | 3 | 15 | 0 | — | — |
| Yellow dye | 2 | 4 | 6 | 10 | 0 | — | — |
| Black organic pigment | — | — | — | — | — | 10 | — |

TABLE 1-continued

| | Amount (g) | | | | | | |
|---|---|---|---|---|---|---|---|
| Raw material | Ex. 1 | Ex. 2 | Ex. 3 | Ex. 4 | Comp. Ex. 1 | Comp. Ex. 2 | Comp. Ex. 3 |
| Black inorganic pigment | — | — | — | — | — | — | 10 |
| cyclohexane | 90 | 180 | 270 | 450 | 0 | 0 | 0 |

<Property Measurement>

(1) Formation of Film and Pattern

The positive photosensitive resin compositions according to Examples 1 to 4 and Comparative Examples 1 to 3 were coated on an ITO glass using a spin-coater and heated on a hot plate at 130° C./2 minutes, forming photosensitive polyimide precursor films.

The polyimide precursor films were exposed to a light using a mask having variously-sized patterns and an I-line stepper (NSR i10C, Nikon Co.), dipped in a 2.38% tetramethyl ammonium hydroxide aqueous solution for 40 seconds at room temperature through two puddles to dissolve and remove the exposed parts, and rinsed with pure water for 30 seconds. Then, the patterns were cured under an oxygen concentration of less than or equal to 1000 ppm at 250° C./60 minutes using an electric oven.

(2) Film Residue Ratio

The pre-baked film was developed in a 2.38% tetramethylammonium hydroxide (TMAH) aqueous solution at 23° C./60 seconds and then, rinsed with pure water for 60 seconds and dried and measured regarding thickness changes which were calculated according to the following Equation 1.

Film residue ratio=(thickness after development/initial thickness before development)*100 [Equation 1]

○: greater than or equal to 95% of film residue ratio
Δ: film residue ratio ranging from 80 to 95%
×: less than or equal to 80% of film residue ratio (3) Sensitivity Sensitivity of the polyimide precursor films was evaluated by measuring exposure time when 10 μm L/S pattern has a 1:1 line width after the exposure and development as an optimal exposure time. Herein, a minimum pattern dimension in the optima exposure time was regarded as a resolution reference.

○: Excellent sensitivity (less than or equal to 50 mJ/cm$^2$)
Δ: Average sensitivity (50 to 200 mJ/cm$^2$)
×: Low sensitivity (greater than or equal to 200 mJ/cm$^2$)

(4) Residue Evaluation

The patterns formed using the positive photosensitive resin compositions were identified regarding residue levels using an optical microscope with a reference to the following references.

○: Many residues
Δ: Medium residues
×: No residue (5) Luminance Evaluation

Modules fabricated using the photosensitive resin compositions were measured regarding luminance (white luminance) using a Minolta luminance meter (Display color analyzer CA-210). The luminance was measured 10 minute later after supplying the modules with electricity for stabilization. In an 8 bit digital system, when R/G/B all have values of 0, black is displayed, while R/G/B all have values of 255, white is displayed. When R/G/B has values of (255, 0, 0), pure red is displayed, when R/G/B has values of (0, 255, 0), green is displayed, and when R/G/B has values of (0, 0, 255), blue is displayed, by giving a signal to one of three primary colors.

Accordingly, when each R, G, and B luminance is measured and added up, the sum should be theoretically equal to white luminance. However, the white luminance may not be obtained according to W=(R+G+B)/3 depending on characteristics of each display. The reason is that each R, G, and B channel has no completely independent characteristics but a light leakage in a particular color. In order to evaluate efficiency of preventing a light leakage, a green pixel was designed to have a light leakage, and its white luminance was measured using a Minolta luminance meter.

○: excellent luminance (white luminance of greater than 250)
Δ: average luminance (245 to 250)
×: low luminance (less than 245)

(6) Dielectric Constant

The photosensitive resin compositions were coated on an ITO glass and treated on a hot plate at 130° C./2 minutes to provide 2.0 to 2.5 μm thick films. Next, a metal electrode (Au) having a diameter of 300 μm was deposited on the films, preparing samples. The samples were measured regarding capacitance using a HP 4294A precision impedance analyzer, and the measurement was used to calculate a dielectric constant according to the following Equation 2.

$C = \epsilon_0 * \epsilon * A/d$ [Equation 2]

In the Equation, C denotes capacitance, $\epsilon_0$ denotes a dielectric constant under vacuum, denotes a non-dielectric constant, A denotes an electrode area, and d denotes the thickness of the film.

○: dielectric constant of less than or equal to 5.5
×: dielectric constant of greater than 5.5

The properties of the films according to Examples 1 to 4 and Comparative Examples 1 to 3 were provided in the following Table 2.

TABLE 2

| | Film residue ratio | Sensitivity | Residue | Luminance | Dielectric constant |
|---|---|---|---|---|---|
| Example 1 | ○ | ○ | ○ | Δ | ○ |
| Example 2 | ○ | ○ | ○ | Δ | ○ |
| Example 3 | ○ | ○ | ○ | ○ | ○ |
| Example 4 | ○ | ○ | ○ | ○ | ○ |
| Comparative Example 1 | ○ | ○ | Δ | X | ○ |
| Comparative Example 2 | Δ | Δ | ○ | X | Δ |
| Comparative Example 3 | Δ | X | Δ | X | X |

The photosensitive resin film including no dye or pigment according to Comparative Example 1 has no light shielding effect, and the photosensitive resin film including a black organic pigment according to Comparative Example 2 had worse residue rate and sensitivity than those according to Examples. In addition, the photosensitive resin film including carbon black (PRIN TEX-U), a black inorganic pigment, according to Comparative Example 3 particularly had a high dielectric constant and thus, low insulating properties. Furthermore, the photosensitive resin film according to Comparative Example 3 had bad film residue ratio, sensitivity, and residue.

On the contrary, the photosensitive resin films according to Examples 1 to 4 had a low dielectric constant as well as excellent light shielding properties. The reason is that the photosensitive resin composition including an organic dye according to the present invention all had improved insulating properties and light shielding properties.

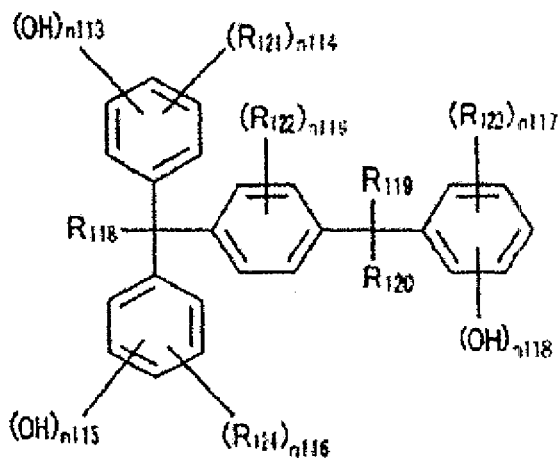

The invention claimed is:

1. A positive photosensitive resin composition, comprising:
   (A) an alkali soluble resin selected from a polybenzoxazole precursor, a polyimide precursor, and a combination thereof;
   (B) a photosensitive diazoquinone compound;
   (C) a phenol compound;
   (D) an organic dye; and
   (E) a solvent,
   wherein the organic dye (D) comprises at least one red dye having an absorption wavelength of 590 to 700 nm, at least one yellow dye having an absorption wavelength of 550 to 590 nm, and at least one blue dye having an absorption wavelength of 450 to 500 nm.

2. The positive photosensitive resin composition of claim 1, wherein the polybenzoxazole precursor comprises a repeating unit represented by the following Chemical Formula 1, or repeating units represented by the following Chemical Formulae 1 and 2, and comprises a thermally polymerizable functional group at at least one terminal end thereof:

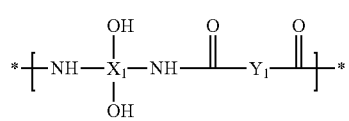

[Chemical Formula 1]

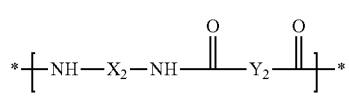

[Chemical Formula 2]

wherein, in Chemical Formulae 1 and 2,
$X_1$ is an aromatic organic group, or a tetravalent to hexavalent aliphatic organic group,
$Y_1$ and $Y_2$ are the same or different, and are independently an aromatic organic group or a divalent to hexavalent aliphatic organic group, and
$X_2$ is an aromatic organic group, divalent to hexavalent aliphatic organic group, divalent to hexavalent alicyclic organic group, or an organic group represented by the following Chemical Formula 3,

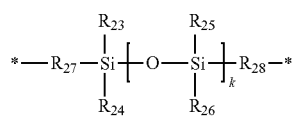

[Chemical Formula 3]

wherein, in Chemical Formula 3,
$R_{23}$ to $R_{26}$ are the same or different, and are independently a substituted or unsubstituted alkyl group, a substituted or unsubstituted aryl group, a substituted or unsubstituted alkoxy group, or a hydroxy group,
$R_{27}$ and $R_{28}$ are the same or different, and are independently a substituted or unsubstituted alkylene group, or a substituted or unsubstituted arylene group, and
k is an integer ranging from 1 to 50.

3. The positive photosensitive resin composition of claim 1, wherein the polyimide precursor comprises repeating units represented by the following Chemical Formula 50 and the following Chemical Formula 51:

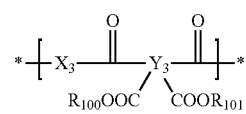

[Chemical Formula 50]

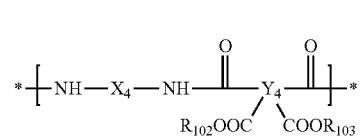

[Chemical Formula 51]

wherein in Chemical Formulae 50 and 51,
$X_3$ is an aromatic organic group, or divalent to hexavalent alicyclic organic groups,
$Y_3$ and $Y_4$ are the same or different, and are independently an aromatic organic group, or tetravalent to hexavalent alicyclic organic groups,
$X_4$ is an aromatic organic group, divalent to hexavalent alicyclic organic groups, or the functional group represented by the above Chemical Formula 3, and
$R_{100}$ to $R_{103}$ are the same or different, and are independently hydrogen, or a substituted or unsubstituted C1 to C20 alkyl group.

4. The positive photosensitive resin composition of claim 1, wherein the red dye having an absorption wavelength of 590 to 700 nm comprises a compound selected from a xanthene-based compound, an azo-based compound, an anthraquinone-based compound, a cyan-based compound, and a combination thereof.

5. The positive photosensitive resin composition of claim 1, wherein the yellow dye having an absorption wavelength of 550 to 590 nm comprises a compound selected from a methane-based compound, an azo-based compound, or a combination thereof.

6. The positive photosensitive resin composition of claim 1, wherein the blue dye having an absorption wavelength of 450 to 500 nm comprises a compound selected from a triphenylmethane (TPM)-based compound, a triarylmethane (TAM)-based compound, a xanthene-based compound, and a combination thereof.

7. The positive photosensitive resin composition of claim 1, wherein the red dye having an absorption wavelength of 590 to 700 nm is a compound represented by the following Chemical Formula 4:

[Chemical Formula 4]

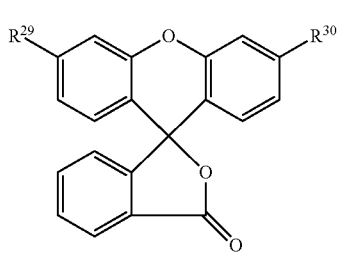

wherein, in Chemical Formula 4,
$R^{29}$ and $R^{30}$ are the same or different, and are independently hydrogen, a substituted or unsubstituted amine group, or a substituted or unsubstituted C1 to C10 alkyl group.

8. The positive photosensitive resin composition of claim 1, wherein the yellow dye having an absorption wavelength of 550 to 590 nm is a compound represented by the following Chemical Formula 5:

[Chemical Formula 5]

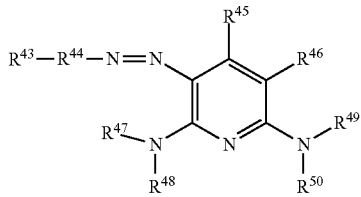

wherein, in Chemical Formula 5,
$R^{43}$ is a substituted or unsubstituted C1 to C20 alkyl group, a C2 to C20 alkylaminoalkyl sulfonyl group, or a C1 to C20 alkyl group wherein at least one —$CH_2$— is replaced by —$SO_2$—, —O—, or —NR— (wherein R is hydrogen or a C1 to C6 alkyl group),
$R^{44}$ is a substituted or unsubstituted C6 to C30 arylene group, or substituted or unsubstituted C2 to C30 heteroarylene group,
$R^{45}$ and $R^{47}$ to $R^{50}$ are independently selected from hydrogen, a substituted or unsubstituted C1 to C20 alkyl group, a C1 to C20 alkyl group wherein at least one —$CH_2$— is replaced by —$SO_2$—, —O— or —NR— (wherein R is hydrogen or a C1 to C10 alkyl group), a substituted or unsubstituted C3 to C20 cycloalkyl group, a substituted or unsubstituted C2 to C20 alkenyl group, a substituted or unsubstituted C6 to C30 aryl group, a substituted or unsubstituted C2 to C30 heterocyclic group, a sulfonylalkyl group (—$SO_2R'$, wherein R' is hydrogen or a C1 to C10 alkyl group), a sulfonylaryl group (—$SO_2R''$, wherein R'' is a C6 to C16 aryl group), an acyl group, a carboxyl group, a sulfone group, and a cabamoyl group, and
$R^{46}$ is selected from hydrogen, a halogen, and a cyano group.

9. The positive photosensitive resin composition of claim 1, wherein the blue dye having an absorption wavelength of 450 to 500 nm is a compound represented by the following Chemical Formula 6:

[Chemical Formula 6]

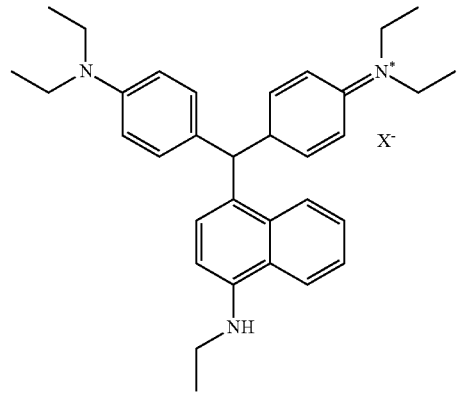

wherein, in Chemical Formula 6,
$X^-$ is $CF_3COO^-$, $CF_3SO_3^-$, $C_4F_9SO_3^-$, $(CF_3SO_2)_3C^-$ or $(CF_3SO_2)_2N^-$.

10. The positive photosensitive resin composition of claim 1, wherein the positive photosensitive resin composition further comprises a silane compound.

11. The positive photosensitive resin composition of claim 1, wherein the positive photosensitive resin composition comprises
5 to 100 parts by weight of a photosensitive diazoquinone compound (B),
1 to 30 parts by weight of the phenol compound (C),
1 to 50 parts by weight of the organic dye (D); and
100 to 400 parts by weight of the solvent (E),
based on 100 parts by weight of the alkali soluble resin (A).

12. A photosensitive resin film fabricated by the process of:
coating the positive photosensitive resin composition of claim 1 onto a substrate; and
drying the coated positive photosensitive resin composition to form a film.

13. A display device including the photosensitive resin film according to claim 12.

* * * * *

UNITED STATES PATENT AND TRADEMARK OFFICE
CERTIFICATE OF CORRECTION

PATENT NO. : 9,256,118 B2
APPLICATION NO. : 14/236971
DATED : February 9, 2016
INVENTOR(S) : Ji-Yun Kwon et al.

It is certified that error appears in the above-identified patent and that said Letters Patent is hereby corrected as shown below:

In the Specification

Column 6, Line 42 reads: "(=NH, =NR, R is a C1 to C10 alkyl group), an amino group"
and should read: "(=NH, =NR, R is a C1 to C10 alkyl group), an amino group (-NH$_2$,"

Column 8, Chemical Formula 7 is depicted as:

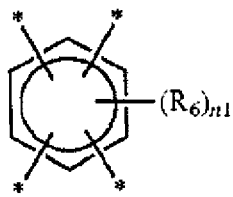

and should be depicted as:

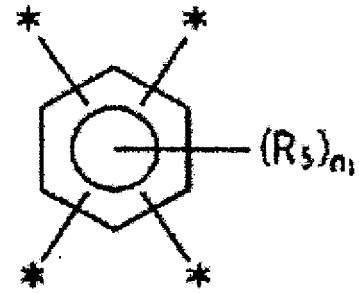

Signed and Sealed this
Nineteenth Day of July, 2016

Michelle K. Lee
*Director of the United States Patent and Trademark Office*

In the Specification
Column 8, Chemical Formula 8 is depicted as:
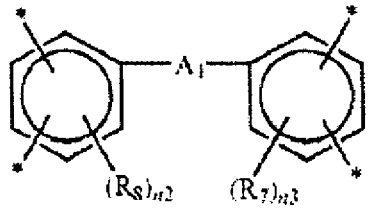
and should be depicted as:
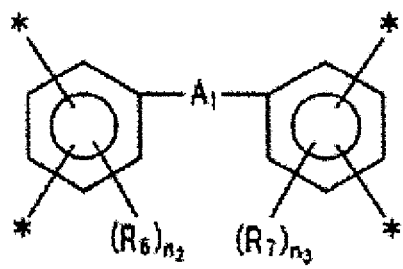
Column 14, Chemical Formula 24 is depicted as:
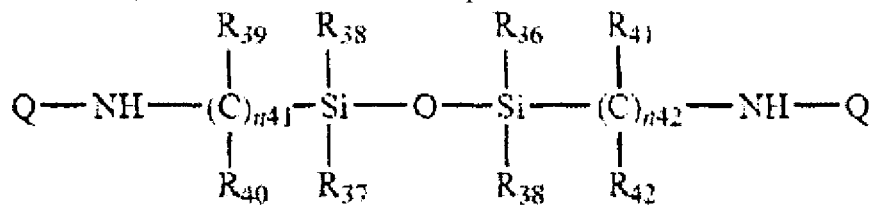
and should be depicted as:
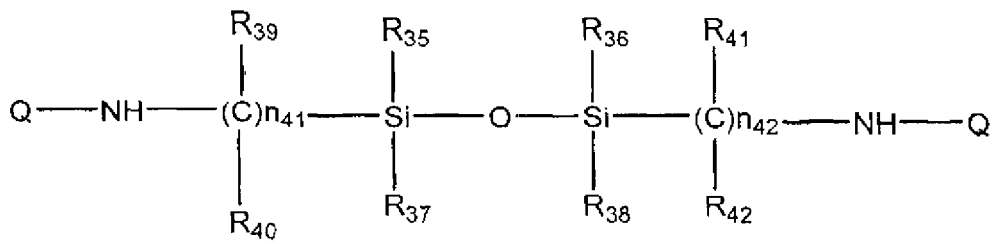

In the Specification
Column 15, Chemical Formula 27 is depicted as:
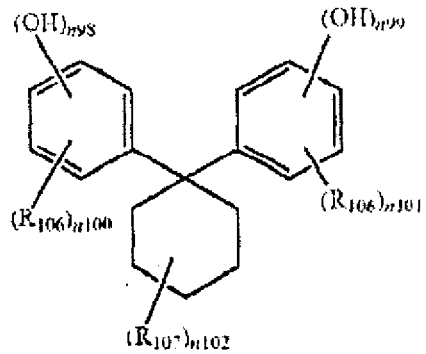
and should be depicted as:
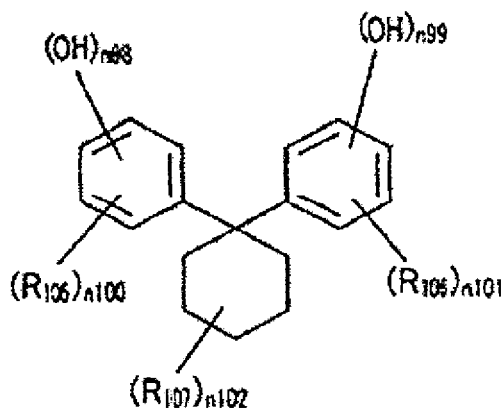
Column 15, Chemical Formula 29 is depicted as:
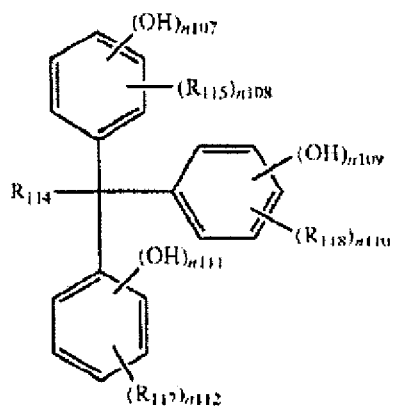
and should be depicted as:
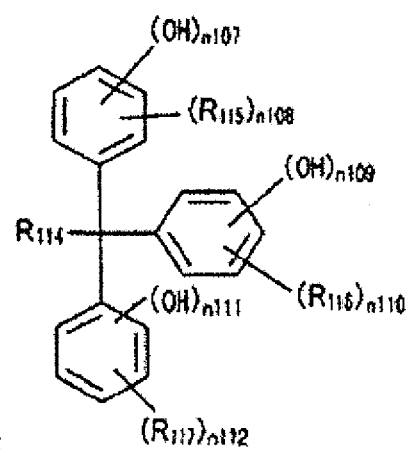

CERTIFICATE OF CORRECTION (continued)
U.S. Pat. No. 9,256,118 B2

In the Specification

Column 16, Chemical Formula 30 is depicted as:

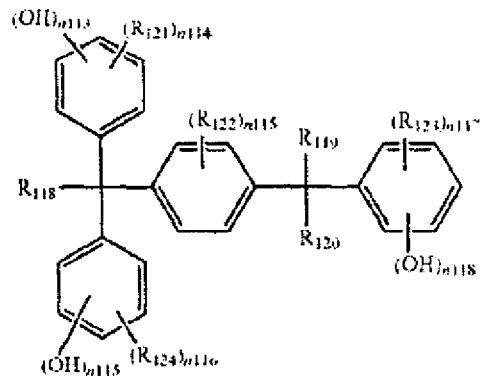

and should be depicted as: